(12) United States Patent
Chai et al.

(10) Patent No.: US 11,930,291 B2
(45) Date of Patent: Mar. 12, 2024

(54) DISPLAY MODULE AND TELEVISION

(71) Applicant: SHENZHEN TCL NEW TECHNOLOGY CO., LTD., Guangdong (CN)

(72) Inventors: Yanfeng Chai, Guangdong (CN); Wei Hua, Guangdong (CN); Xudong Wang, Guangdong (CN); Xiaoxu Dong, Guangdong (CN); Bing Li, Guangdong (CN); Taicheng Chen, Guangdong (CN)

(73) Assignee: Shenzhen TCL New Technology Co., Ltd., Shenzhen (CN)

( * ) Notice: Subject to any disclaimer, the term of this patent is extended or adjusted under 35 U.S.C. 154(b) by 562 days.

(21) Appl. No.: 17/258,167

(22) PCT Filed: Dec. 23, 2019

(86) PCT No.: PCT/CN2019/127403
§ 371 (c)(1),
(2) Date: Jan. 6, 2021

(87) PCT Pub. No.: WO2020/135327
PCT Pub. Date: Jul. 2, 2020

(65) Prior Publication Data
US 2021/0289160 A1 Sep. 16, 2021

(30) Foreign Application Priority Data
Dec. 28, 2018 (CN) .......................... 201811632224.9

(51) Int. Cl.
*H05K 5/00* (2006.01)
*H04N 5/64* (2006.01)

(52) U.S. Cl.
CPC ............. *H04N 5/64* (2013.01); *H05K 5/0004* (2013.01); *H05K 5/0017* (2013.01)

(58) Field of Classification Search
None
See application file for complete search history.

(56) References Cited

U.S. PATENT DOCUMENTS 10,310,330 B2 6/2019 Liu
2013/0100371 A1* 4/2013 Yu ..................... G02F 1/133308
349/58

(Continued)

FOREIGN PATENT DOCUMENTS

CN 206353230 U 7/2017
CN 107219661 A 9/2017

(Continued)

OTHER PUBLICATIONS

Extended European Search Report dated Feb. 10, 2022 From European Patent Office Re. Application No. EP19903716.9.

(Continued)

*Primary Examiner* — Steven M Marsh
(74) *Attorney, Agent, or Firm* — Nathan & Associates; Menacham Nathan

(57) ABSTRACT

Disclosed are a display module and a television, the display module including: a back plate including a back plate body and a side wall which are integrally formed, the back plate body and the side wall together defining a mounting space, a free end of the side wall being folded so as to form a connecting flange which extends towards the back plate body, a free end of the connecting flange being folded so as to form a joining flange which extends in parallel with the back plate body; a display screen, an edge of an inside surface of the display screen being fixed to an outer surface of the joining flange; an optical film set mounted in the mounting space.

20 Claims, 5 Drawing Sheets

(56) References Cited

U.S. PATENT DOCUMENTS

| | | | |
|---|---|---|---|
| 2016/0062034 A1* | 3/2016 | Hirayama | G02B 6/005 349/65 |
| 2016/0187567 A1 | 6/2016 | Zhou | |
| 2018/0017827 A1* | 1/2018 | Kil | G02F 1/133308 |
| 2020/0225529 A1* | 7/2020 | Yamanaka | G02F 1/133308 |
| 2021/0263571 A1* | 8/2021 | Dong | G06F 1/1601 |

FOREIGN PATENT DOCUMENTS

| | | |
|---|---|---|
| CN | 206638918 U | 11/2017 |
| CN | 108616707 A | 10/2018 |
| CN | 208041841 U | 11/2018 |
| CN | 109510960 A | 3/2019 |
| CN | 209105353 U | 7/2019 |
| JP | 2017187711 A | 10/2017 |
| WO | 2018166034 A1 | 9/2018 |

OTHER PUBLICATIONS

International Search Report in corresponding PCT Application No. PCT/CN2019/127403, dated Mar. 24, 2020 and Written Opinion of the International Searching Authority in corresponding PCT Application No. PCT/CN2019/127403, dated Mar. 24, 2020.

* cited by examiner

DISPLAY MODULE AND TELEVISION

CROSS-REFERENCE TO RELATED APPLICATIONS

This application is the National stage of International Application No. PCT/CN2019/127403, filed on Dec. 23, 2019, which claims priority to Chinese Patent Application No. 201811632224.9, filed on Dec. 28, 2018 and entitled "Display Module and Television", the entire disclosure of which is incorporated herein by reference.

TECHNICAL FIELD

The present disclosure relates to the field of display devices, and in particular to a display module and a television.

BACKGROUND

Nowadays, in common display devices (such as televisions, computer monitors, etc.), the display module usually includes a back plate, a middle frame, a front frame, a display screen, and an optical film set. The back plate, the middle frame and the front frame together contain the display screen and the optical film set. Obviously, a common display device has many parts, assembly steps are complicated, and the assembly of product is really inconvenient.

SUMMARY

The main objective of the present disclosure is to provide a display module, which aims to improve the ease of assembly of the product.

In order to achieve the above objective, the display module provided by the present disclosure includes:
- a back plate including a back plate body and a side wall, the back plate body and the side wall being integrally formed and together defining a mounting space, a free end of the side wall being folded to form a connecting flange extending toward the back panel body, and a free end of the connecting flange being folded to form a joining flange extending in parallel with the back plate body;
- a display screen, an edge of an inside surface of the display screen being fixed to an outside surface of the joining flange; and
- an optical film set mounted in the mounting space.

Optionally, the edge of the inside surface of the display screen is bonded to the outside surface of the joining flange; or
  the joining flange is integrally stamped and formed with a bending buckle to restrict the display screen from being separated from the joining flange; and/or
  the outside surface of the joining flange is stamped and formed with a glue storage groove, the edge of the inside surface of the display screen is bonded to the outside surface of the joining flange through adhesive glue, and the glue storage groove is filled with the adhesive glue; and/or
  a width of a cross section of the glue storage groove is gradually increased in a depth direction.

Optionally, an end surface of the free end of the side wall is higher than or flushed with an outside surface of the display screen.

Optionally, there are a plurality of side walls, joining flanges of two adjacent side walls are provided in a mutual butt joint way and welded and fixed at a butt joint.

Optionally, the optical film set includes a first film disposed adjacent to an inner side of the display screen, and an edge of the first film is provided with a side protrusion;
  the joining flange is provided with an avoiding notch, the avoiding notch is provided with a mounting member, the mounting member is defined with a mounting sink on an outside surface, and the side protrusion is clamped in the mounting sink.

Optionally, a depth of the mounting sink is not less than a thickness of the side protrusion.

Optionally, the mounting member is in an elongated strip shape, and both ends of the mounting member in a longitudinal direction are riveted and fixed to two opposite side edges of the avoiding notch; or
  the mounting member is clamped or glued to the avoiding notch; and/or
  the opposite two side edges of the avoiding notch are set to be sunk; and/or
  the mounting member is a sheet metal piece, an injection molded piece or a casting piece.

Optionally, the side protrusion is defined with a hanging hole, the mounting sink is provided with a hooking protrusion, and the hanging hole is engaged with the hooking protrusion; or
  the side protrusion is bonded to the mounting sink; and/or
  an area of the mounting sink is larger than an area of the side protrusion; and/or
  the hanging hole is larger than the hooking protrusion.

Optionally, the optical film set includes a light guide plate provided at an inner side of the display screen, a positioning member is provided at an inner side of the side wall, and a side edge of the light guide plate is abutted against the positioning member.

Optionally, the positioning member is mounted on an inside surface of the side wall; or
  the positioning member is mounted on an inside surface of the back plate body, and adjacent to the side wall; and/or
  the positioning member is bonded to or detachably mounted to the back plate.

Optionally, the positioning member includes a first positioning block attached to the inside surface of the side wall, and a second positioning block bent and extended from a side of the first positioning block close to the back plate body, a free end of the second positioning block is abutted against the side edge of the light guide plate.

Optionally, a free end of the joining flange is provided with a positioning notch at a position corresponding to the positioning member; and/or
  the positioning member is an elastic positioning member; and/or
  the positioning member is a rubber member or a silicone member; and/or
  the positioning member is a white rubber member.

The present disclosure further provides a television, including the display module as described above.

In technical solutions of the present disclosure, the back plate is integrally formed with the joining flange for directly connecting the edge of the inside surface of the display screen. In this way, parts such as the middle frame and the front frame can be reduced, thereby reducing the assembly steps of the display module, making the assembly of the display module more convenient, and saving labor costs. On the other hand, it also reduces materials and saves material costs, and there is no need to consider the size fit between the back plate and the middle frame and the front frame during the development and preparation of the back plate, which makes the product development and preparation easier, and as long as the dimensional accuracy of the back plate meets the requirements, the product quality can be guaranteed. In addition, since the free end of the side wall and the connecting flange are also higher than the joining flange, the free end of the side wall and the connecting flange can also provide collision protection for a side edge of the display screen, thus reducing the probability of the display screen cracking due to side collision. Furthermore, in this technical solution, a protrusion-like structure is also formed between the free end of the side wall 12 and the connecting flange 14, which is beneficial to enhance the structural rigidity.

BRIEF DESCRIPTION OF THE DRAWINGS

In order to more clearly illustrate the embodiments of the present disclosure, drawings used in the embodiments will be briefly described below. Obviously, the drawings in the following description are only some embodiments of the present disclosure. It will be apparent to those skilled in the art that other figures can be obtained according to the structures shown in the drawings without creative work.

Figure 1:
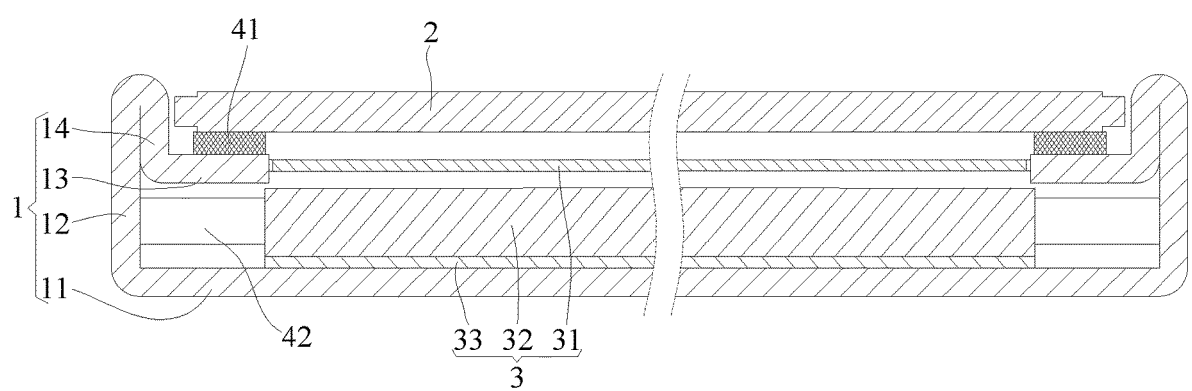
FIG. 1 is a schematic cross-sectional structural view of a display module according to an embodiment of the present disclosure.

The realization of the objective, functional characteristics, and advantages of the present disclosure are further described with reference to the accompanying drawings.

DETAILED DESCRIPTION OF THE EMBODIMENTS

The technical solutions of the embodiments of the present disclosure will be described in more detail below with reference to the accompanying drawings. It is obvious that the embodiments to be described are only some rather than all of the embodiments of the present disclosure. All other embodiments obtained by persons skilled in the art based on the embodiments of the present disclosure without creative efforts shall fall within the scope of the present disclosure.

It should be noted that if there is a directional indication (such as up, down, left, right, front, rear . . . ) in the embodiments of the present disclosure, the directional indication is only used to explain the relative positional relationship, movement, etc. of the components in a certain posture (as shown in the drawings). If the specific posture changes, the directional indication will change accordingly.

It should be noted that, the descriptions associated with, e.g., "first" and "second," in the present disclosure are merely for descriptive purposes, and cannot be understood as indicating or suggesting relative importance or impliedly indicating the number of the indicated technical feature. Therefore, the feature associated with "first" or "second" can expressly or impliedly include at least one such feature. Besides, the meaning of "and/or" appearing in the disclosure includes three parallel scenarios. For example, "A and/or B" includes only A, or only B, or both A and B. In addition, the technical solutions between the various embodiments can be combined with each other, but they must be based on the realization of those of ordinary skill in the art. When the combination of technical solutions is contradictory or cannot be achieved, it should be considered that such a combination of technical solutions does not exist, nor is it within the scope of the present disclosure.

The present disclosure provides a display module, which can be applied to display devices such as computer monitors and televisions.

As shown in FIG. 1, in an embodiment of the present disclosure, the display module includes:

a back plate 1 including a back plate body 11 and a side wall 12 integrally formed and together defining a mounting space, and a free end of the side wall 12 being folded to form a connecting flange 14 extending toward the back panel body 11, and a free end of the connecting flange 14 being folded to form a joining flange 13 extending in parallel with the back plate body 11 (generally, the joining flange 13 is parallel to the back plate body 11, of course, the joining flange 13 may also be slightly inclined to the back plate body 11);

a display screen 2, an edge of an inside surface of the display screen 2 being connected and fixed to an outside surface of the joining flange 13; and an optical film set 3 mounted in the mounting space.

It should be noted that in this embodiment, the back plate body 11 is parallel to the display screen 2 (generally, the display screen 2 is parallel to the back plate body 11, and the display screen 2 can also be slightly inclined to the back plate body 11). The side wall 12 is bent relative to the back plate body 11, and the optical film set 3 is located between the display screen 2 and the back plate body 11. Further, in this embodiment, the free end of the side wall 12 refers to an end of the side wall 12 far away from the back plate body 11, and the free end of the connecting flange 14 refers to an end of the connecting flange 14 far away from the free end of the side wall 12. In this embodiment, the connecting flange is configured to connect the free end of the side wall 12 and the joining flange 13, and the joining flange 13 is configured to provide mounting attachment and support for the edge of the inside surface of the display screen 2.

It can be understood that in this embodiment, the back plate 1 is provided as a sheet metal part and integrally formed by a sheet metal stamping process, which facilitate batch preparation of the back plate 1. In addition, sheet metal materials usually have good heat dissipation efficiency, which is conducive to the heat dissipation of the display module. Without loss of generality, in this embodiment, the side wall 12 is also folded with respect to the back plate body 11. The display screen 2 is a LCD screen.

In technical solutions of this disclosure, the back plate 1 is integrally formed with the joining flange 13 for directly connecting the edge of the inside surface of the display screen 2. In this way, parts such as the middle frame and the front frame can be reduced, thereby reducing the assembly steps of the display module, making the assembly of the display module more convenient, and saving labor costs. On the other hand, it also reduces materials and saves material costs, and there is no need to consider the size fit between the back plate 1 and the middle frame and the front frame during the development and preparation of the back plate 1, which makes the product development and preparation easier, and as long as the dimensional accuracy of the back plate 1 meets the requirements, the product quality can be guaranteed. In addition, since the connecting flange 14 extends toward the back plate body 11, that is, the free end of the side wall 12 and the connecting flange 14 are also higher than the joining flange 13, the free end of the side wall 12 and the connecting flange 14 can also provide collision protection for a side edge of the display screen 2, thus reducing the probability of the display screen 2 cracking due to side collision. Furthermore, in the technical solutions, a protrusion-like structure is also formed between the free end of the side wall 12 and the connecting flange 14, which is beneficial to enhance the structural rigidity.

In this embodiment, the edge of the inside surface of the display screen 2 is optionally bonded to the outside surface of the joining flange 13. Generally, double-sided glue 41, adhesive glue, etc. may be used to achieve the bonding between the display screen 2 and the joining flange 13. The fixing manner of bonding is simple in structure, however, this design is not limited to this. In other embodiments, a bending buckle can be integrally stamped on the joining flange 13 to restrict the display screen 2 from being disengaged from the joining flange 13. In this embodiment, a glue storage groove 411 is punch formed on an outside surface of the joining flange 13 to increase the use amount and bonding area of the adhesive glue when bonding with adhesive glue, so as to improve the bonding reliability between the display screen 2 and the joining flange 13. Further, a width of a cross section of the glue storage groove 411 gradually increases in a depth direction. For example, the cross section has a dovetail shape. In this way, after the adhesive glue in the glue storage groove 411 is cured and shaped, a wedge-shaped connection structure is formed between the adhesive glue and the glue storage groove 411, which can improve the connection strength between the adhesive glue and the display screen 2 and make the fixing of the display screen 2 more reliable.

Further, in this embodiment, an end surface of the free end of the side wall 12 is higher than the outside surface of the display screen 2, compared with the technical solution that the end surface of the free end of the side wall 12 is lower than the outside surface of the display screen 2, the free end of the side wall 12 and the connecting flange 14 of this technical solution can completely cover the side edge of the display screen 2, thus preventing the side edge of the display screen 2 from being collided, and further providing more effective collision protection for the side edge of the display screen 2. Of course, in other embodiments, the end surface of the free end of the side wall 12 can be flush with the outside surface of the display screen 2, so that the free end of the side wall 12 and the connecting flange 14 can completely cover the side edge of the display screen 2. It should be noted that the end surface of the free end of the side wall 12 refers to an end surface of an end of the side wall 12 away from the back plate body 11.

Figure 4:
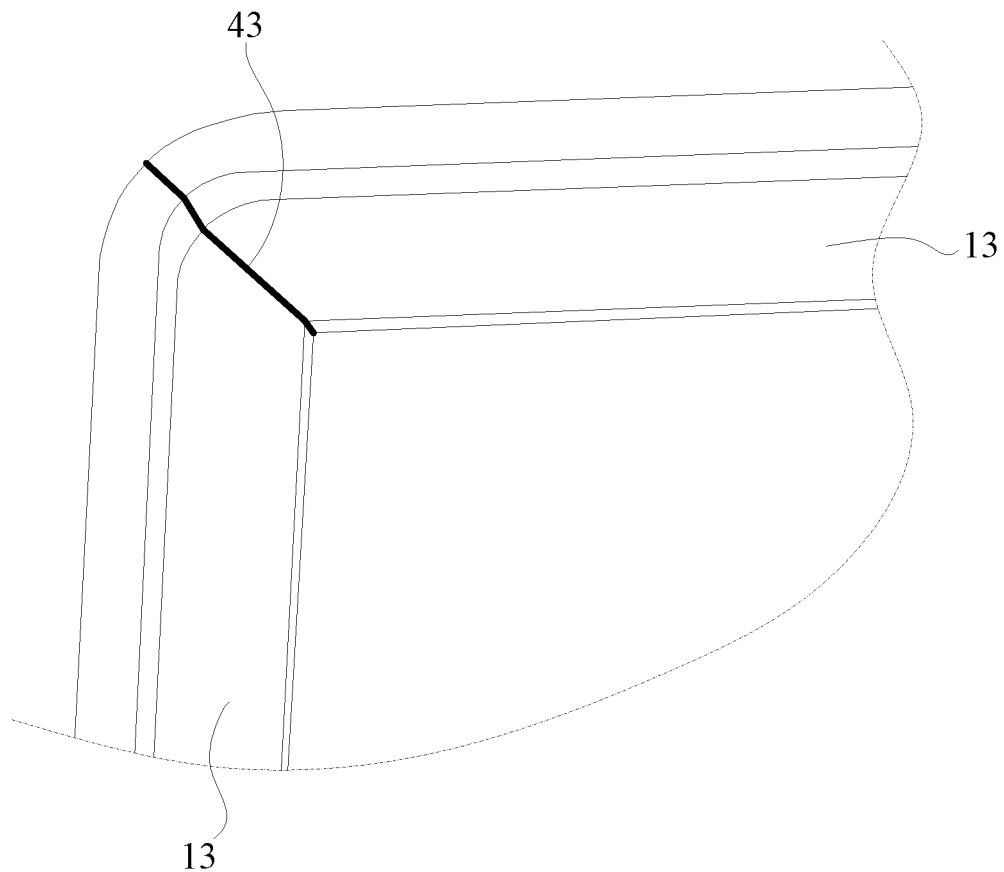
FIG. 4 is a schematic structural view of a corner of the display module in FIG. 1; the display screen and an optical film set are hidden.

Further, referring to FIG. 4, in this embodiment, a plurality of side walls 12 are provided. The joining flanges 13 of two adjacent side walls 12 are provided in a mutual butt joint way so that different joining flanges 13 of different side walls 12 are flushed with each other to facilitate smooth connecting of inside edges of the display screen 2. In addition, the joining flanges 13 of two adjacent side walls 12 are welded and fixed at a butt joint, so that the joining flanges 13 on the side walls 12 are connected into a whole to obtain stronger support rigidity and provide better guarantee for the overlapping stability of the inside edges of the display screen 2. In this embodiment, in order to shorten a length of the weld 43 and improve the production efficiency of the product, the weld 43 at the butt joint is optionally in a straight line. Of course, in other embodiments, the weld 43 at the butt joint may be continuously bent.

Figure 2:
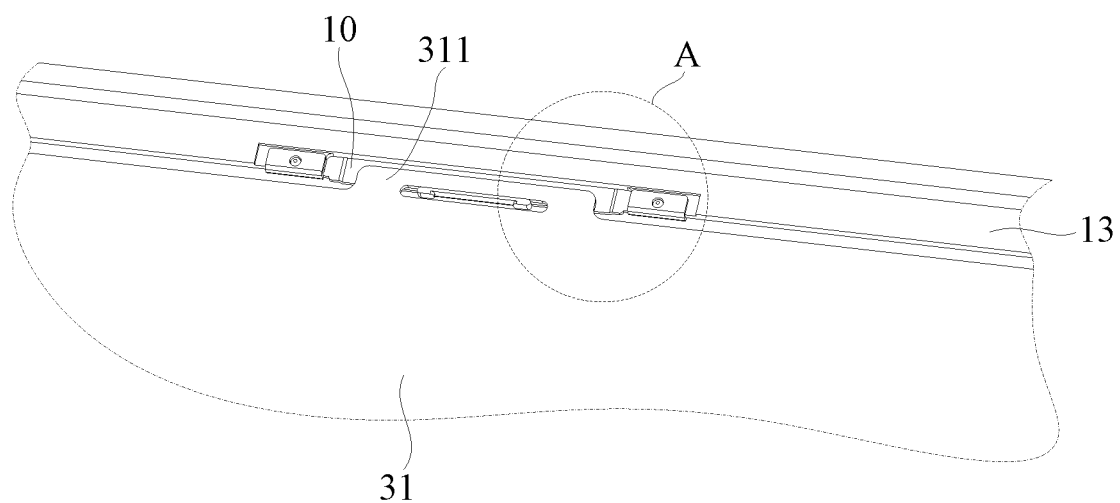
FIG. 2 is a schematic view of a part of the display module in FIG. 1; the display screen is hidden.
Figure 3:
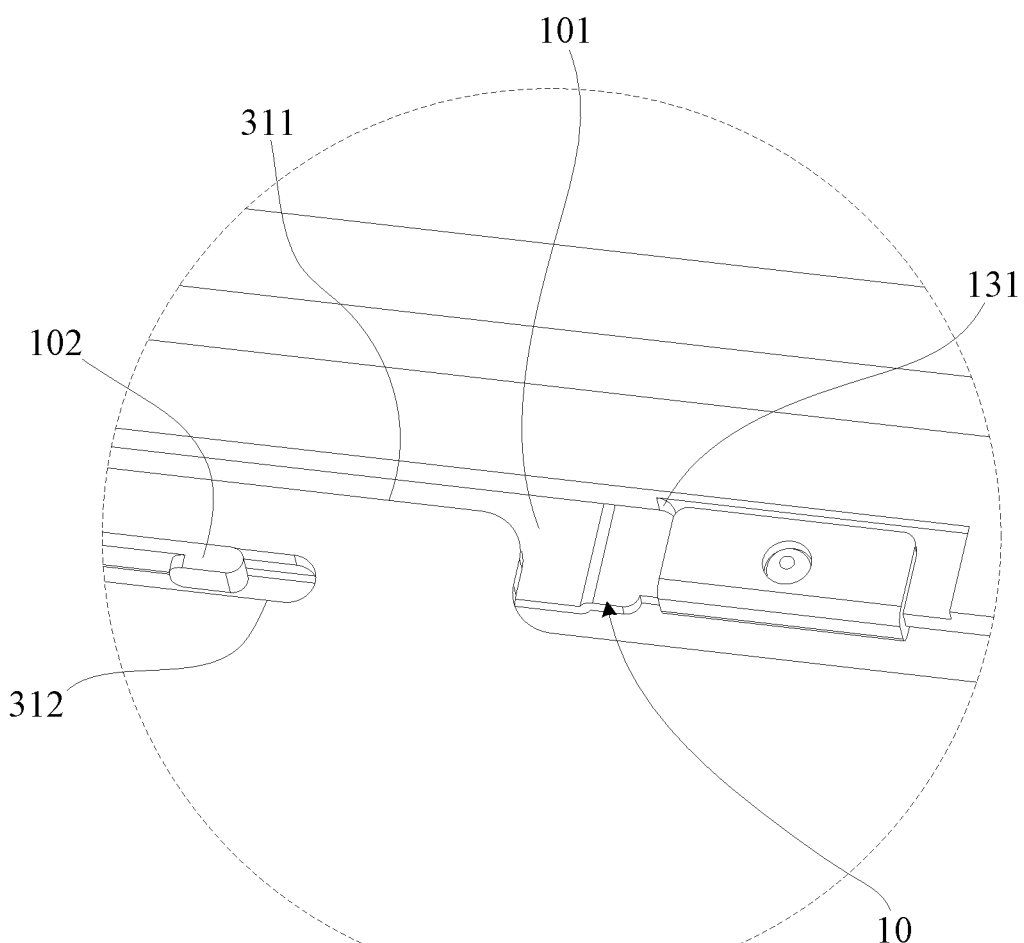
FIG. 3 is an enlarged view of portion A in FIG. 2.

Referring to FIGS. 2 and 3, in this embodiment, further, the optical film set 3 includes a first film 31 adjacent to an inner side of the display screen 2, and an edge of the first film 31 is provided with a side protrusion 311. The joining flange 13 is defined with an avoiding notch 131, and the avoiding notch 131 is provided with a mounting member 10. An outside surface of the mounting member 10 is formed with a mounting sink 101. The side projection 311 of the first film 31 is clamped in the mounting sink 101 to provide positioning and certain support for the first film 31. It can be understood that the mounting sink 101 is recessed relative to the outside surface of the mounting member 10 for snap-in positioning and support of the side protrusion 311. Typically, the plurality of side walls 12 include a left side wall, a right side wall, and a top side wall. The mounting member 10 is generally disposed on the joining flange 13 of the top side wall. Without loss of generality, the first film 31 may be a brightness enhancement film, a diffusion film, or the like. It should be noted that, at an inner side of the first film 31, the optical film set 3 may further include a second film, a third film, etc. having other optical properties.

In this embodiment, generally, a depth of the mounting sink 101 on the mounting member 10 is not less than a thickness of the side protrusion 311 to avoid the side protrusion 311 hindering the installation between the edge of the inside surface of the display screen 2 and the joining flange 13. Of cause in some special cases, the thickness of the side protrusion 311 can also be allowed to be slightly larger than the depth of the mounting sink 101, as long as the thickness of the side protrusion 311 is not greater than the sum of the depth of the mounting sink 101 and the thickness of an adhesive layer (double-sided glue 41 or adhesive glue).

Figure 6:
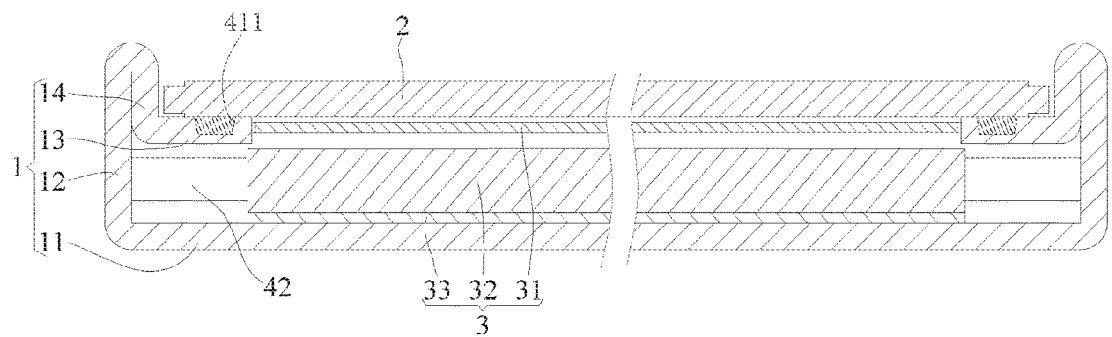

FIG. 6 is a schematic cross-sectional structural view of a display module according to another embodiment of the present disclosure.

In addition, in this embodiment, the mounting member 10 is optionally in a long strip shape, and both ends in a longitudinal direction of the mounting member 10 are riveted and fixed to two opposite side edges of the avoiding notch 131, so that the mounting member 10 can be stably and reliably fixed by rivets as long as riveting holes are correspondingly punched at two opposite ends of the mounting member 10 and opposite side edges of the avoiding notch 131. It can be understood that in this embodiment, the mounting member 10 is also generally provided as a sheet metal piece. Of course, in other embodiments, the mounting member 10 can be an injection molded piece or a cast piece, and the mounting member 10 can be fixed cross the avoiding notch 131 by clamping or bonding. It should be noted that in this embodiment, in order to prevent the ends of the mounting member 10 in the longitudinal direction from hindering the mounting between the inside edge of the display screen 2 and the joining flange 13, the opposite side edges of the avoiding notch 131 are also generally sunk.

In this embodiment, further, a hanging hole 312 is provided on the side protrusion 311, and a hooking protrusion 102 is provided on the mounting sink 101. The side protrusion 311 is hooked with the hooking protrusion 102 of the mounting member through the hooking hole 312, to conveniently mount the first film 31 on the joining flanges 13. However, this design is not limited thereto, in other embodiments, the side protrusion 311 of the first film 31 can be bonded to the mounting sink 101 of the mounting member 10. Optionally, an area of the mounting sink 101 on the mounting member 10 is greater than an area of the side protrusion 311 on the first film 21 to facilitate assembly. Similarly, the hanging hole 312 on the side protrusion 311 is larger than the hooking protrusion 102 on the mounting sink 101.

As shown in FIG. 1, in this embodiment, the optical film set 3 further includes a light guide plate 32 provided at the inner side of the display screen 2, a positioning member 42 is provided on an inner side of the side wall 12, an side edge of the light guide plate 32 is abutted against the positioning member 42 to facilitate the positioning and installation of the light guide plate 32. Without loss of generality, the first film 31 is located between the light guide plate 32 and the display screen 2. Generally, in order to improve the backlight efficiency, the optical film set 3 further includes a reflective sheet 33 between the light guide plate 32 and the back plate body 11. In this embodiment, generally, a bottom of the back plate body 11 is empty for mounting a backlight strip. The inner sides of the left side wall, the right side wall and the top side wall are all provided with positioning members 42 to position the light guide plate 32 and avoid shaking of the light guide plate 32. However, this design is not limited to this. In other embodiments, the positioning members 42 can be provided at two corners away from the bottom edge of the back plate body 11.

In this embodiment, the positioning member 42 is mounted on the inside surface of the side wall 12. However, this design is not limited to this. In other embodiments, the positioning member 42 can be mounted on the inside surface of the back plate body 11. Generally, the positioning member 42 will be adjacent to the side wall 12 at this time. In this embodiment, the positioning member 42 is adhered to the back plate 1. However, this design is not limited to this. In other embodiments, the positioning member 42 can also be detachably mounted on the back plate 1 (for example, but not limited to a tight fitting and embedding manner), so as to facilitate the replacement of the positioning member 42.

In this application, further, the positioning member 42 includes a first positioning block attached to the inside surface of the side wall 12, and a second positioning block formed by bending and extending from a side of the first positioning block close to the back plate body 11; and a free end of the second positioning block is abutted against the side edge of the light guide plate 32. It can be understood that the first positioning block can provide the positioning member 42 with a larger area connected to the inside surface of the side wall 12, thereby making the installation of the positioning member 42 on the side wall 12 more stable.

Figure 5:
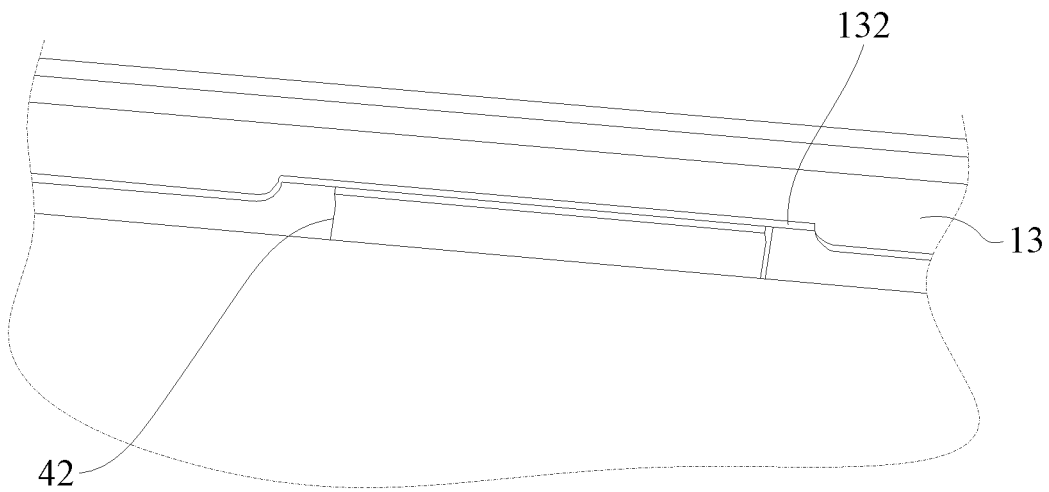
FIG. 5 is a schematic structural view of another part of the display module in FIG. 1; the display screen is hidden.

Besides, as shown in FIG. 5, in this embodiment, a free end of the joining flange 13 is provided with a positioning notch 132 at a position corresponding to the positioning member 42 to facilitate the fitting and installation of the positioning member 42 and the side wall 12, and it is also beneficial to indicate an installation position of the positioning member 42.

Further, in this embodiment, the positioning member 42 is configured as an elastic positioning member, that is to say, the positioning member 42 has elasticity, so as to avoid the phenomenon that the light guide plate 32 and the positioning member are difficult to match due to component tolerances. In an embodiment, the positioning member 42 may be configured as a rubber member, a silicone member, or the like. In addition, in order to prevent the positioning member 42 from absorbing light and affecting the backlight effect, the positioning member 42 can be a white rubber member.

The present disclosure also provides a television including a display module, and the specific structure of the display module refers to the above-mentioned embodiment. Since this television adopts all the technical solutions of all the foregoing embodiments, it has at least all the beneficial effects brought about by the technical solutions of the foregoing embodiments, which will not be repeated here.

The above are only some embodiments of the present disclosure, and do not limit the scope of the present disclosure thereto. Under the inventive concept of the present disclosure, equivalent structural transformations made according to the description and drawings of the present disclosure, or direct/indirect application in other related technical fields are included in the scope of the present disclosure.

What is claimed is:

1. A display module, comprising:
a back plate comprising a back plate body and a side wall, the back plate body and the side wall being integrally formed and together defining a mounting space, a free end of the side wall being folded to form a connecting flange extending toward the back plate body, and a free end of the connecting flange being folded to form a joining flange extending in parallel with the back plate body;
a display screen, an edge of an inside surface of the display screen being fixed to an outside surface of the joining flange; and
an optical film set mounted in the mounting space.

2. The display module as claimed in claim 1, wherein,
the edge of the inside surface of the display screen is bonded to the outside surface of the joining flange through double-sided glue; or
the outside surface of the joining flange is stamped and formed with a glue storage groove, the edge of the inside surface of the display screen is bonded to the outside surface of the joining flange through adhesive glue, and the glue storage groove is filled with the adhesive glue; and a width of a cross section of the glue storage groove is gradually increased in a depth direction of the glue storage groove.

3. The display module as claimed in claim 1, wherein,
an end surface of the free end of the side wall is higher than or flushed with the outside surface of the display screen.

4. The display module as claimed in claim 1, wherein there are a plurality of side walls, joining flanges of two adjacent ones of the side walls are provided in a mutual butt joint way and welded and fixed at a butt joint.

5. The display module as claimed in claim 1, wherein, the optical film set comprises a first film disposed adjacent to an inner side of the display screen, and an edge of the first film is provided with a side protrusion;
the joining flange is provided with an avoiding notch, the avoiding notch is provided with a mounting member, the mounting member is defined with a mounting sink on an outside surface of the mounting member, and the side protrusion is clamped in the mounting sink.

6. The display module as claimed in claim 5, wherein a depth of the mounting sink is not less than a thickness of the side protrusion.

7. The display module as claimed in claim 5, wherein, the mounting member is in an elongated strip shape, and both ends of the mounting member in a longitudinal direction are riveted and fixed to two opposite side edges of the avoiding notch, or the mounting member is clamped or glued to the avoiding notch;
the two opposite side edges of the avoiding notch are set to be sunk; and the mounting member is a sheet metal piece, an injection molded piece or a casting piece.

8. The display module as claimed in claim 5, wherein the side protrusion is defined with a hanging hole, the mounting sink is provided with a hooking protrusion, an area of the mounting sink is larger than an area of the side protrusion, and the hanging hole is engaged with the hooking protrusion; or the side protrusion is bonded to the mounting sink; and the hanging hole is larger than the hooking protrusion.

9. The display module as claimed in claim 1, wherein the optical film set comprises a light guide plate provided at an inner side of the display screen, a positioning member is provided at an inner side of the side wall, and a side edge of the light guide plate is abutted against the positioning member.

10. The display module as claimed in claim 9, wherein the positioning member is mounted on an inside surface of the side wall; or the positioning member is mounted on an inside surface of the back plate body, and adjacent to the side wall; and the positioning member is bonded to or detachably mounted to the back plate.

11. The display module as claimed in claim 9, wherein the positioning member comprises a first positioning block attached to the inside surface of the side wall, and a second positioning block bent and extended from a side of the first positioning block close to the back plate body, a free end of the second positioning block is abutted against the side edge of the light guide plate.

12. The display module as claimed in claim 9, wherein, a free end of the joining flange is provided with a positioning notch at a position corresponding to the positioning member;

the positioning member is an elastic positioning member;
the positioning member is a rubber member or a silicone member; and
the rubber member is a white rubber member.

13. A television comprising:
a display module, the display module comprising:
a back plate comprising a back plate body and a side wall, the back plate body and the side wall being integrally formed and together defining a mounting space, a free end of the side wall being folded to form a connecting flange extending toward the back plate body, and a free end of the connecting flange being folded to form a joining flange extending in parallel with the back plate body;
a display screen, an edge of an inside surface of the display screen being fixed to an outside surface of the joining flange; and
an optical film set mounted in the mounting space.

14. The television as claimed in claim 13, wherein,
the edge of the inside surface of the display screen is bonded to the outside surface of the joining flange through double-sided glue; or the outside surface of the joining flange is stamped and formed with a glue storage groove, the edge of the inside surface of the display screen is bonded to the outside surface of the joining flange through adhesive glue, and the glue storage groove is filled with the adhesive glue; and a width of a cross section of the glue storage groove is gradually increased in a depth direction of the glue storage groove.

15. The television as claimed in claim 13, wherein, an end surface of the free end of the side wall is higher than or flushed with the outside surface of the display screen.

16. The television as claimed in claim 13, wherein there are a plurality of side walls, joining flanges of two adjacent ones of the side walls are provided in a mutual butt joint way and welded and fixed at a butt joint.

17. The television as claimed in claim 13, wherein, the optical film set comprises a first film disposed adjacent to an inner side of the display screen, and an edge of the first film is provided with a side protrusion;

the joining flange is provided with an avoiding notch, the avoiding notch is provided with a mounting member, the mounting member is defined with a mounting sink on an outside surface of the mounting member, and the side protrusion is clamped in the mounting sink.

18. The television as claimed in claim 17, wherein, the mounting member is in an elongated strip shape, and both ends of the mounting member in a longitudinal direction are riveted and fixed to two opposite side edges of the avoiding notch or the mounting member is clamped or glued to the avoiding notch;

the two opposite side edges of the avoiding notch are set to be sunk; and the mounting member is a sheet metal piece, an injection molded piece or a casting piece.

19. The television as claimed in claim 13, wherein the optical film set comprises a light guide plate provided at an inner side of the display screen, a positioning member is provided at an inner side of the side wall, and a side edge of the light guide plate is abutted against the positioning member.

20. The television as claimed in claim 19, wherein, a free end of the joining flange is provided with a positioning notch at a position corresponding to the positioning member;

the positioning member is an elastic positioning member;
the positioning member is a rubber member or a silicone member; and
the rubber member is a white rubber member.

* * * * *